United States Patent
Takahashi (10) Patent No.: US 7,154,424 B2
(45) Date of Patent: Dec. 26, 2006

(54) DIGITAL EQUALIZATION APPARATUS

(75) Inventor: Toshihiko Takahashi, Kawachinagano (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/787,596

(22) Filed: Feb. 27, 2004

(65) Prior Publication Data

US 2004/0189498 A1    Sep. 30, 2004

(30) Foreign Application Priority Data

Feb. 28, 2003    (JP)    ............... 2003-053624

(51) Int. Cl.
*H03M 1/84*    (2006.01)
(52) U.S. Cl. .................... 341/138; 341/155
(58) Field of Classification Search ........ 341/138, 341/155, 143, 156, 157, 120, 121, 122, 123, 341/50, 61; 369/59, 124, 58; 327/553; 375/232; 708/323; 360/67, 53, 32
See application file for complete search history.

(56) References Cited

U.S. PATENT DOCUMENTS 4,222,072 A * 9/1980 Bailey et al. ............... 386/124
6,052,349 A * 4/2000 Okamoto ................. 369/47.26
6,249,395 B1 * 6/2001 Conway ....................... 360/51
6,385,239 B1 * 5/2002 Okamoto et al. ........... 375/232
6,639,537 B1 * 10/2003 Raz .............................. 341/155

FOREIGN PATENT DOCUMENTS

JP    01233920 A    9/1989

* cited by examiner

*Primary Examiner*—Brian Young
(74) *Attorney, Agent, or Firm*—Wenderoth, Lind & Ponack, L.L.P.

(57) ABSTRACT

A digital equalization apparatus is provided with an analog low pass filter for removing a high-frequency component from an input analog signal, a non-linear analog to digital (A/D) converter for non-linearly sampling the analog signal to output a digital signal, and an equalizer 2 for waveform-equalizing the digital signal outputted from the non-linear A/D converter. The non-linear A/D converter non-linearly A/D converts the analog signal so that, with a center value of amplitude of the analog signal being a reference, resolution per least significant bit (LSB) becomes higher as an input center of the non-linear A/D converter is closer to the center value while the resolution per LSB becomes lower as the input center of the non-linear A/D converter is farther from the center value.

12 Claims, 10 Drawing Sheets

DIGITAL EQUALIZATION APPARATUS

FIELD OF THE INVENTION

The present invention relates to an equalization apparatus to be used in an information storage device such as a hard disk device or an optical disk device and, more particularly, to a digital equalization apparatus for non-linearly converting an analog signal into a digital signal, and waveform-equalizing the digital signal.

BACKGROUND OF THE INVENTION

In recent years, recording densities of information storage devices, such as hard disk devices and optical disk devices, have been increased. However, when a signal is recorded at a high density on an information storage device, an amplitude difference may occur in a reproduced signal (analog signal) according to variations in cycles of the recorded signal when the recorded signal is reproduced. This problem is caused because the amplitude of a high-frequency component of the reproduced signal is reduced as the recording density is increased. As a main factor responsible for the reduction in the amplitude, there is an inter symbol interference (ISI). Therefore, the information storage device requires, with an increase in the recording density, signal processing that compensates for a reduction in the amplitude of the high-frequency component of the reproduced signal.

Conventionally, when a reproduced signal (analog signal) is subjected to analog signal processing in an information storage device, a reduction in signal amplitude of a high-frequency component is compensated for by using an analog equalizer. An analog equalizer has an equalization characteristic for passing a signal component of a desired frequency and, simultaneously, providing a gain. Therefore, by adjusting the equalization characteristic to a desired frequency, a reduction in the signal amplitude can be selectively compensated.

There are two methods described below as conventional methods for compensating for a reduction in signal amplitude of a high-frequency component when a reproduced signal (analog signal) is subjected to a digital signal processing.

A first method includes waveform-equalizing an analog signal using an analog equalizer, and thereafter, converting the analog signal into a digital signal. Hereinafter, a conventional equalization apparatus for realizing this first method will be described with reference to FIG. 13. Generally, an information storage device is provided with an equalization apparatus. In the equalization apparatus shown in FIG. 13, initially, an analog filter 67 receives an analog signal, and removes signal components that are unnecessary for waveform equalization. Next, an analog equalizer 87 waveform-equalizes the analog signal outputted from the analog filter 67. At this time, the analog equalizer 87 is given an equalization characteristic that allows high-frequency components of the analog signal to pass. Thereby, a reduction in signal amplitude can be selectively compensated. Next, an A/D converter 57 converts the analog signal 117 outputted from the analog equalizer 87 into a digital signal. Then, a binarizer 37 binarizes the digital signal 157 outputted from the A/D converter 57.

A second method employs a digital equalizer. In this case, a digital equalizer for waveform-equalizing a digital signal is provided in a stage subsequent to an A/D converter. After an analog signal is converted into a digital signal, the digital signal is waveform-equalized by the digital equalizer. When the digital equalizer is employed, however, the resolution of the A/D converter must be enhanced. The reason is as follows. When the resolution of the A/D converter is high, required information can be satisfactorily obtained from the high-frequency component in which the signal amplitude is reduced, when performing A/D conversion of the analog signal before waveform equalization and having a large difference in amplitude. In order to enhance the resolution of the A/D converter, there is a method of increasing the number of bits to be A/D converted.

Hereinafter, a description will be given of problems that occur when a reproduced signal in which an amplitude difference has occurred is waveform-equalized using an analog equalizer or a digital equalizer as mentioned above.

When an analog equalizer is employed, a problem occurs when the frequency of the analog signal to be waveform-equalized changes with the passage of time like the reproduced signal obtained by CAV reproduction. In this case, it is necessary to change the equalization characteristic of the analog equalizer in accordance with the frequency of the analog signal, resulting in an increase in the circuit scale and a reduction in the signal processing speed.

Figure 13:
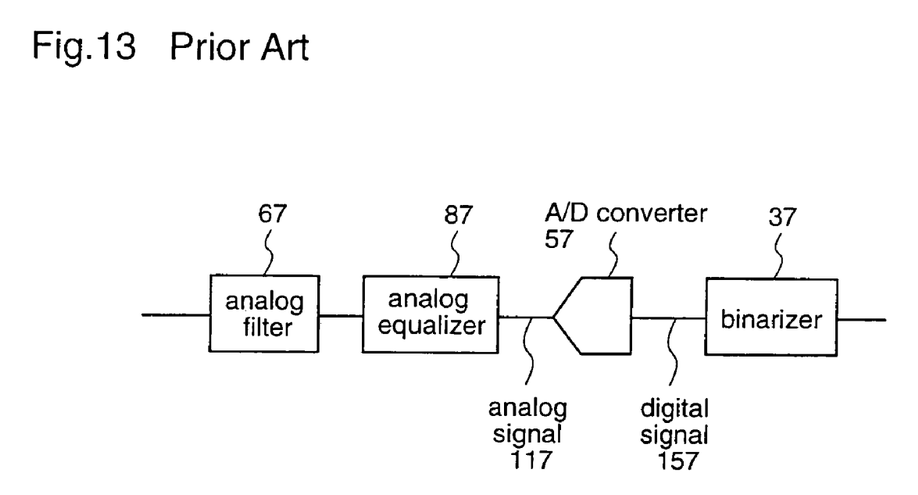
FIG. 13 is a block diagram illustrating a conventional digital equalization apparatus.

Furthermore, when the analog equalizer is employed, a problem occurs when a signal processing device, such as the conventional equalization apparatus shown in FIG. 13, is realized by a system LSI. When realizing a signal processing device by a system LSI, it is necessary to integrate, on a single chip, an analog circuit, a digital circuit, a memory, and the like which have conventionally been constituted as different LSI circuits. Amongst these circuits, the analog circuit occupies a very large area in the system LSI (CMOS). That is, the analog circuit causes an increase in cost.

On the other hand, when a digital equalizer is employed, it is necessary to increase the A/D resolution of the previous-stage A/D converter. Because the circuit scale of the A/D converter increases in proportion to the number of bits to be A/D converted, the circuit scale of the A/D converter increases when the A/D resolution is increased. Further, circuit delay is increased when the resolution is increased, resulting in a reduction in the signal processing speed.

SUMMARY OF THE INVENTION

The present invention is made to solve the above-described problems and has for its object to provide a digital equalization apparatus that efficiently waveform-equalizes an analog signal having a large amplitude difference, without increasing the circuit scale, by using a digital equalizer.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided a digital equalization apparatus to be used in an information storage device such as a hard disk device or an optical disk device, and the apparatus comprises a non-linear A/D converter for non-linearly sampling an analog signal to convert it into a digital signal; and a digital equalizer for waveform-equalizing the digital signal outputted from the non-linear A/D converter. Therefore, it is possible to accurately waveform-equalize a signal component that includes more significant information in an analog signal having a large amplitude difference. Further, it is not necessary to increase the circuit scale of the non-linear A/D converter in order to enhance the resolution. Furthermore, since no analog equalizer is employed, the circuit scale can be reduced at integrating on a system LSI.

According to a second aspect of the present invention, in the digital equalization apparatus according to the first aspect, the non-linear A/D converter has a non-linear characteristic realized by an arbitrary function.

According to a third aspect of the present invention, in the digital equalization apparatus according to the first aspect, the non-linear A/D converter changes a weight of resolution per LSB (Least Significant Bit) in A/D conversion such that, with a center value of amplitude of the analog signal being a reference value, the resolution per LSB becomes higher as an input center of the non-linear A/D converter is closer to the center value while the resolution per LSB becomes lower as the input center of the non-linear A/D converter is farther from the center value.

According to a fourth aspect of the present invention, in the digital equalization apparatus according to the first aspect, the non-linear A/D converter changes a weight of resolution per LSB in A/D conversion such that, with a point at a predetermined distance from a center value of the analog signal being a reference value, the resolution per LSB becomes higher with increasing proximity to the reference value while the resolution per LSB becomes lower with decreasing proximity to the reference value.

According to a fifth aspect of the present invention, in the digital equalization apparatus according to the first aspect, the non-linear A/D converter changes a weight of resolution per LSB in A/D conversion such that, with a center value of the analog signal being a reference value, the resolution per LSB becomes relatively high within a range until a predetermined distance from the center value while the resolution per LSB becomes relatively low within a range that is more than the predetermined distance apart from the center value.

According to a sixth aspect of the present invention, there is provided a digital equalization apparatus to be used in an information storage device such as a hard disk device or an optical disk device, and the apparatus comprises a function generator for giving a non-linear characteristic shown by an arbitrary function to an analog signal; an A/D converter for converting the analog signal outputted from the function generator into a digital signal; and a digital equalizer for waveform-equalizing the digital signal outputted from the A/D converter.

According to a seventh aspect of the present invention, the digital equalization apparatus according to the first aspect comprises, instead of the digital equalizer, a low-pass filter for waveform-equalizing the digital signal outputted from the non-linear A/D converter; and the low-pass filter removes a harmonic distortion component of the digital signal generated by the non-linear A/D converter.

According to an eighth aspect of the present invention, the digital equalization apparatus according to the first aspect comprises, instead of the digital equalizer, an adaptive filter for comparing the signal level of the digital signal outputted from the non-linear A/D converter with a desired signal level, and feeding a difference between the signal levels back to the equalization characteristic, thereby adaptively waveform-equalizing the digital signal all the time.

According to a ninth aspect of the present invention, the digital equalization apparatus according to the first aspect comprises an offset detector for detecting a deviation of the analog signal inputted to the non-linear A/D converter from a reference voltage, from the digital signal outputted from the non-linear A/D converter; and an offset controller for giving an offset to the analog signal on the basis of the output of the offset detector. Therefore, it is possible to non-linearly A/D convert a center portion of the analog signal including significant information at higher resolution by matching the input center of the non-linear A/D converter to the amplitude center of the analog signal inputted to the non-linear A/D converter.

According to a tenth aspect of the present invention, the digital equalization apparatus according to the ninth aspect comprises an asymmetry detector for detecting asymmetry of the analog signal inputted to the non-linear A/D converter, from the digital signal outputted by the non-linear A/D converter; and the offset controller gives an offset to the analog signal, and changes the reference voltage level of the analog signal according to the asymmetry, on the basis of the output of the offset detector and the output of the asymmetry detector. Therefore, it is possible to non-linearly A/D convert a center portion of the analog signal including significant information at higher resolution by matching the input center of the non-linear A/D converter to the amplitude center of the analog signal inputted to the non-linear A/D converter.

According to an eleventh aspect of the present invention, there is provided a digital equalization apparatus to be used in an information storage device such as a hard disk device or an optical disk device, and the apparatus comprises an A/D converter for converting an analog signal into a digital signal; a digital equalizer for waveform-equalizing the digital signal outputted from the A/D converter; and a controller for receiving the digital signal outputted from the A/D converter, and controlling a higher-potential-side reference voltage and a lower-potential-side reference voltage of the A/D converter, according to the signal level of the analog signal inputted to the A/D converter.

According to a twelfth aspect of the present invention, in the digital equalization apparatus according to the eleventh aspect, the controller detects offsets as deviations of the analog signal inputted to the A/D converter from the reference voltages, and asymmetry of the analog signal, from the digital signal outputted from the A/D converter, and demodulates the higher-potential-side reference voltage and the lower-potential-side reference voltage of the A/D converter, thereby removing the offsets.

DETAILED DESCRIPTION OF THE PREFERRED EMBODIMENTS

Hereinafter, preferred embodiments of the present invention will be described with reference to the drawings.

Embodiment 1

A digital equalization apparatus according to a first embodiment of the present invention will be described with reference to FIGS. 1~3, 14, and 15. The digital equalization apparatus according to the first embodiment converts an analog signal into a digital signal by using a non-linear A/D converter, and waveform-equalizes the digital signal.

Figure 1:
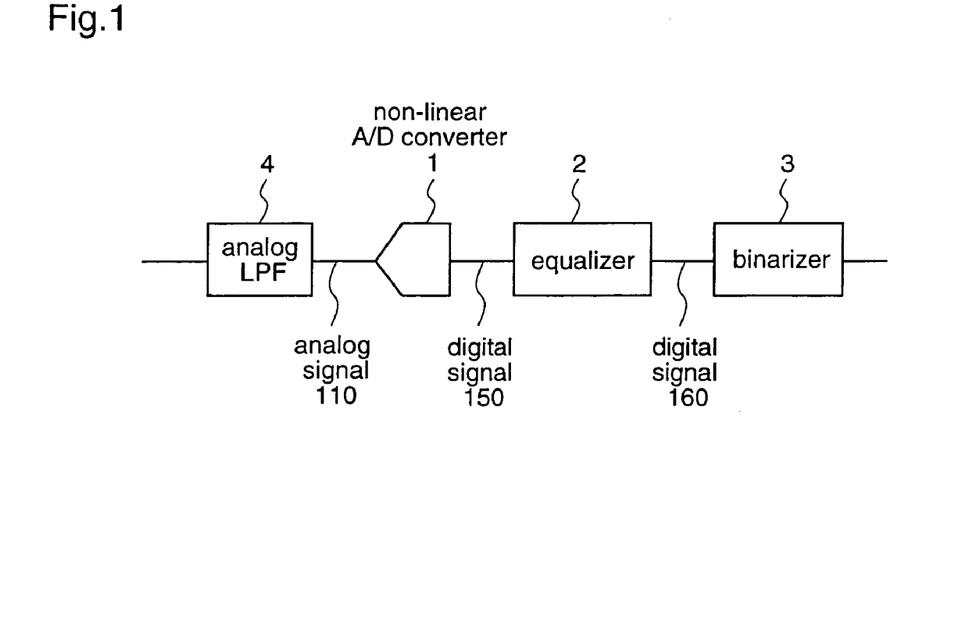
FIG. 1 is a block diagram illustrating a digital equalization apparatus according to a first embodiment of the present invention.

FIG. 1 is a block diagram illustrating the construction of the digital equalization apparatus according to the first embodiment. As shown in FIG. 1, this digital equalization apparatus is provided with an analog LPF (Low Pass Filter) 4, a non-linear A/D converter 1, an equalizer 2 as a digital equalizer, and a binarizer 3.

Figure 2:
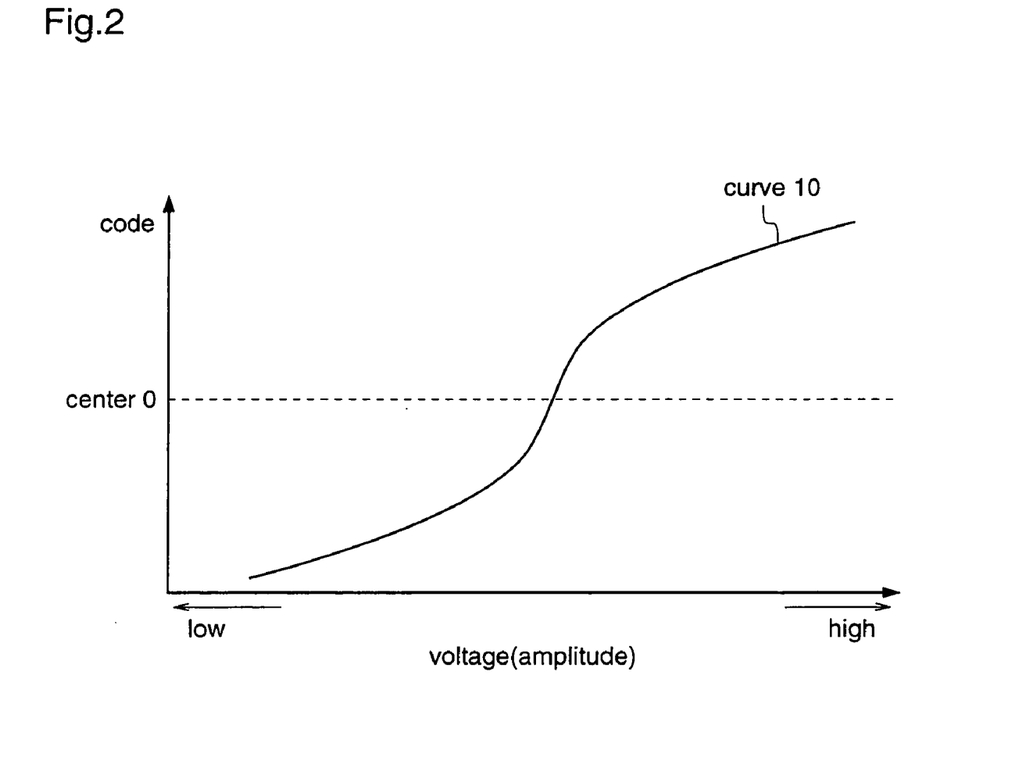
FIG. 2 is a schematic diagram illustrating an example of a function that realizes non-linear characteristics.
Figure 3:
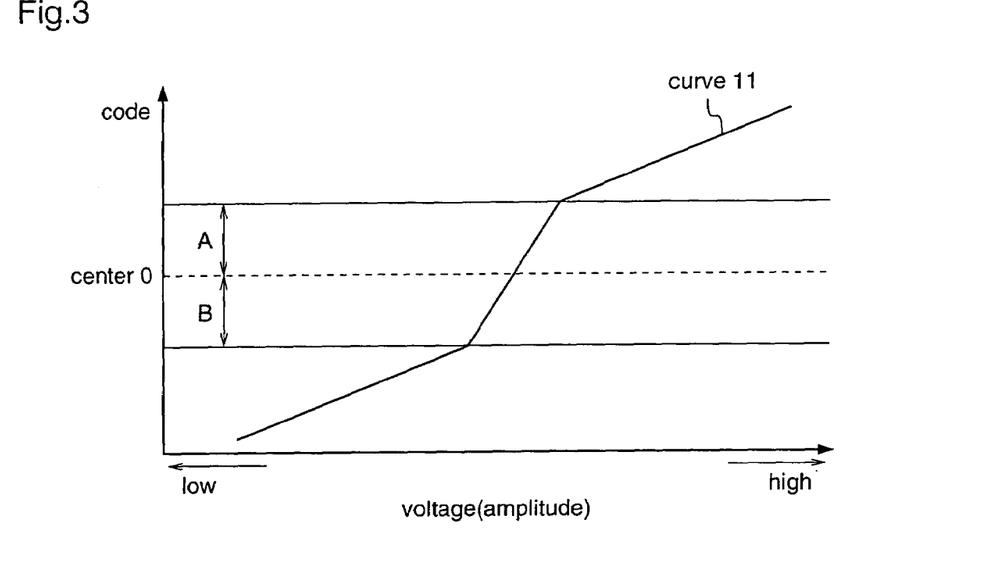
FIG. 3 is a schematic diagram illustrating another example of a function that realizes non-linear characteristics.
Figure 14:
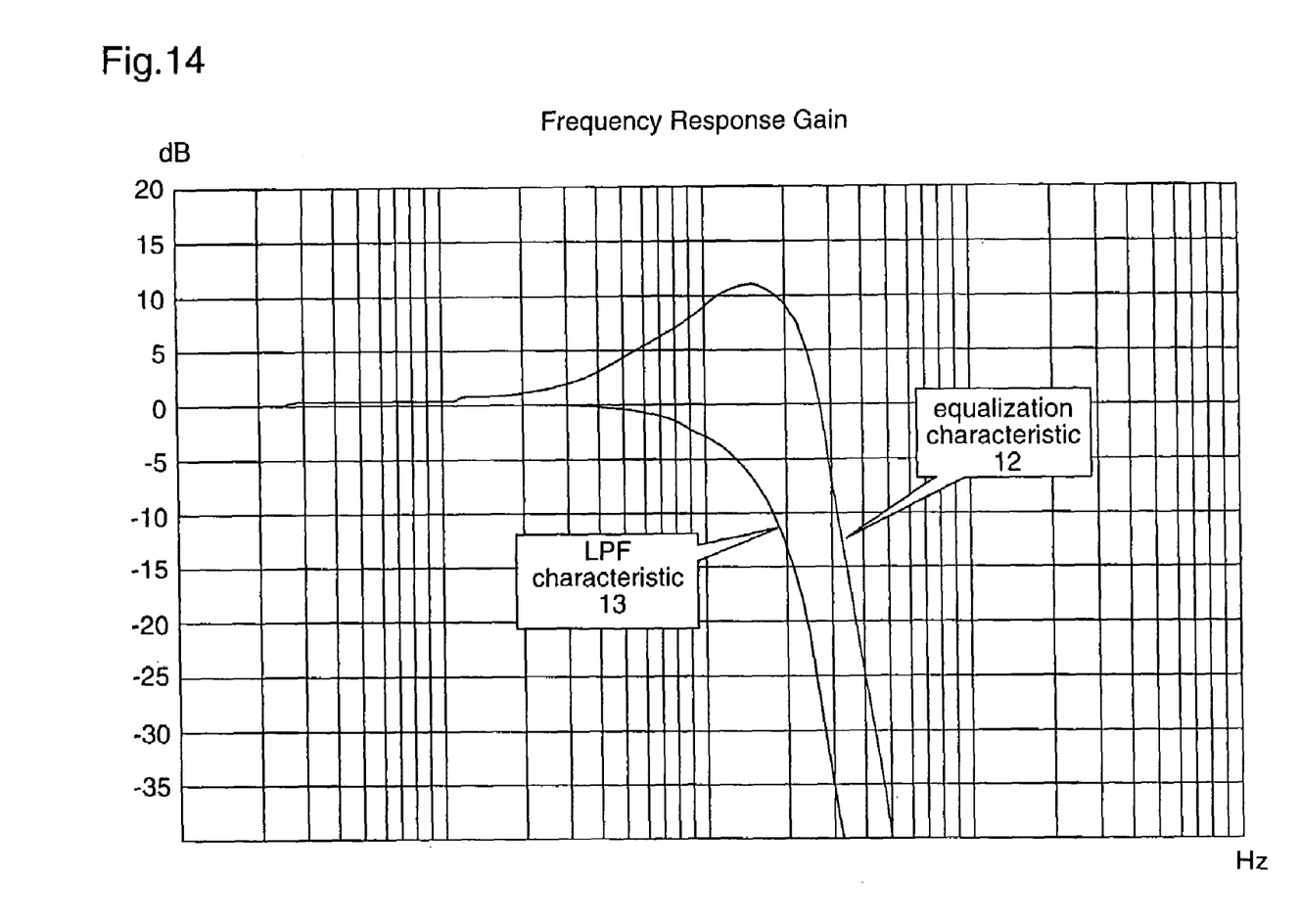
FIG. 14 is a schematic diagram illustrating equalization characteristics of an equalizer, and LPF characteristics of an LPF.
Figure 15A:
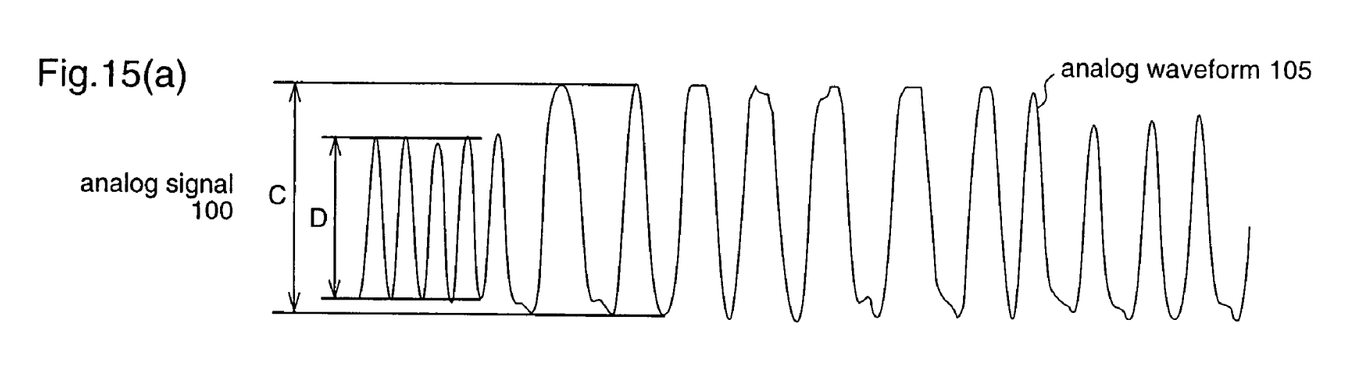
FIG. 15(a) is a schematic diagram illustrating an analog signal.
Figure 15B:
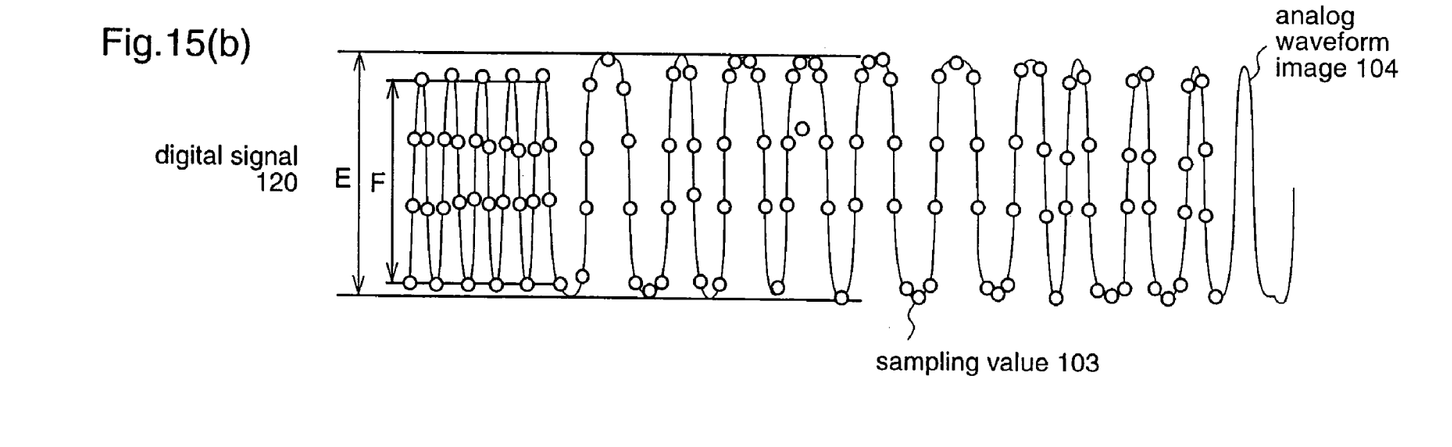
FIG. 15(b) is a schematic diagram illustrating a digital signal.

Next, the operation of the digital equalization apparatus constituted as described above will be described with reference to FIGS. 2, 3, 14, and 15. FIGS. 2 and 3 are schematic diagrams illustrating examples of non-linear characteristics of the non-linear A/D converter 1. FIG. 14 is a schematic diagram illustrating an example of equalization characteristics of the equalizer 2. FIG. 15(a) is a schematic diagram illustrating an analog waveform of an analog signal. FIG. 15(b) is a schematic diagram illustrating a digital signal that is obtained by non-linearly A/D converting the analog signal.

First of all, the analog LPF 4 removes high frequency components from the inputted analog signal to avoid an occurrence of aliasing distortion in the non-linear A/D converter 1. Next, the non-linear A/D converter 1 operates at a system clock, non-linearly samples the analog signal 110, and outputs a digital signal 150. Next, the equalizer 2 waveform-equalizes the digital signal 150. The digital equalizer 2 has the equalization characteristics shown in FIG. 14, and removes harmonic distortion components that are caused by the non-linear A/D conversion. The equalization characteristics may be set to frequency characteristics that compensate for a reduction in the signal amplitude. The binarizer 3 binarizes the digital signal so as to enable treatments, such as ECC, in the subsequent signal processing.

Hereinafter, the non-linear A/D converting operation of the non-linear A/D converter 1 will be described in detail. In this first embodiment, it is assumed that the analog signal 110 is an analog signal 100 shown in FIG. 15(a). The analog signal 100 has an analog waveform 105, and an amplitude difference occurs in the analog signal 100. In FIG. 15(a), "C" indicates a signal amplitude showing a maximum frequency, and "D" indicates a signal amplitude of a high-frequency component. The non-linear A/D converter 1 has a non-linear characteristic realized by an arbitrary function. To be specific, the non-linear A/D converter 1 realizes the non-linear characteristic using an arbitrary function which has a predetermined position in the signal amplitude as a reference point, increases the A/D resolution in the vicinity of the reference point, and compensates for a reduction in the signal amplitude of the high-frequency component.

Hereinafter, a description will be given of the case where the non-linear characteristic is realized by a logarithmic function shown in FIG. 2. The logarithmic function shown by a curve 10 in FIG. 2 is a function that provides, with the center of amplitude of the analog signal (center value 0) being a reference, a higher resolution per minimum unit (Least Significant Bit: LSB) with increasing proximity to the center value, and a lower resolution with decreasing proximity to the center value. In order to increase the resolution, the number of divided bits corresponding to a code of voltage having a predetermined width should be increased. When the analog signal 110 is non-linearly sampled by the non-linear A/D converter 1 having the above-mentioned non-linear characteristic, a digital signal 120 as shown in FIG. 15(b) is obtained as the digital signal 150. However, in the schematic diagram, the digital signal is expressed by white circles (O), and solid lines connecting the circles are auxiliary lines for contrasting the digital signal with the analog signal. As shown in FIGS. 15(a) and 15(b), the amplitude difference E/F shown by the analog waveform image 104 of the digital signal 120 is smaller than the amplitude difference C/D shown by the analog waveform 105 of the analog signal 100. As described above, by sampling the analog signal non-linearly, more information can be obtained from the signal component of the desired frequency, and the analog signal having a large amplitude difference can be converted into a digital signal while reducing the amplitude difference.

Figure 12:
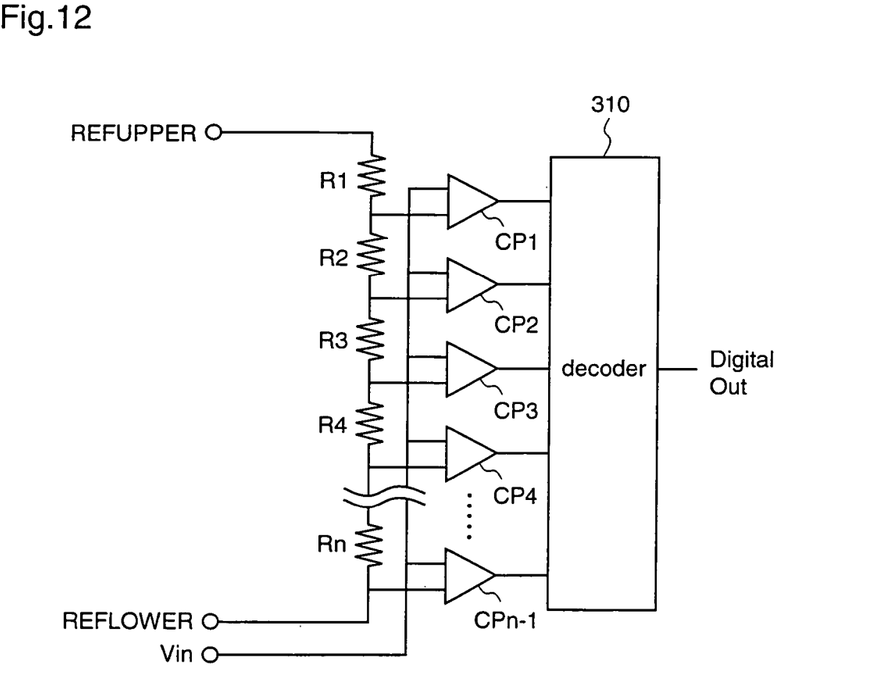
FIG. 12 is a schematic diagram illustrating an internal structure of a general A/D converter.

Subsequently, the construction of the A/D converter that realizes the above-mentioned non-linear A/D conversion will be described with reference to FIG. 12. FIG. 12 is a schematic diagram illustrating the construction of a general A/D converter. As shown in FIG. 12, the A/D converter is provided with resistors R1~Rn, comparators CP1~CPn−1, and a decoder 310. Further, in FIG. 12, "REFUPPER" indicates a terminal at the higher voltage side of a reference voltage, "REFLOWER" indicates a terminal at the lower voltage side of the reference voltage, and "Vin" indicates an input terminal of an analog signal. When a high reference voltage and a low reference voltage are input to the A/D converter constituted as described above, a difference voltage between the high reference voltage and the low reference voltage is potential-divided by the resistors R1~Rn having equal resistance values. Next, the comparators CP1~CPn compare the divided voltages and the input voltage of the analog signal. Then, the decoder 310 converts the comparison results from the comparators into an output code having a predetermined number of bits. In order to increase the number of conversion bits, i.e., the resolution, more resistors and more comparators are required.

In this first embodiment, the resistance values of the respective resistors R1~Rn of the A/D converter are changed so that the division ratio shows a non-linear characteristic. Thereby, a non-linear A/D converter that can realize non-linear A/D conversion is constituted without changing the constituents other than the resistors R1~Rn. That is, a non-linear A/D converter can be constituted from a common A/D converter without changing the circuit scale.

As described above, the digital equalization apparatus according to the first embodiment is provided with the non-linear A/D converter 1 having a non-linear characteristic realized by an arbitrary function, and the digital equalizer 2 for removing harmonic distortion components caused by the non-linear A/D conversion. A non-linear characteristic of the non-linear A/D converter 1 is realized by an arbitrary function which has a predetermined position in the signal amplitude as a reference point, increases the A/D resolution per LSB in the vicinity of the reference point, and compensates for a reduction in the signal amplitude of the high-frequency component. Thereby, a signal component including more significant information in the analog signal having a large amplitude difference can be waveform-equalized with accuracy, using the non-linear A/D converter and the digital equalizer. Furthermore, it is not necessary to increase the circuit scale of the non-linear A/D converter to increase the resolution.

While in this first embodiment the non-linear characteristic is realized by the logarithmic function having the curve 10, the function for realizing the non-linearity is not restricted thereto. For example, it may be a function which has, as a reference point, a point that is predetermined distance apart from a center value, and provides a higher resolution per LSB with increasing proximity to the reference point, and a lower resolution with decreasing proximity to the reference point. Alternatively, it may be a function having a curve 11 as shown in FIG. 3. The curve 11 shows a function which has, as a reference point, the center value 0 of the amplitude of the analog signal 110, and provides a relatively high resolution per LSB in an area up to a position that is an arbitrary distance A or B apart from the center value, and a relatively low resolution per LSB in an area outside the position as a boundary. The distance A and the distance B are not necessarily equal to each other.

Furthermore, while in this first embodiment the non-linear A/D converter is constituted using resistors, the constitution of the non-linear A/D converter is not restricted thereto. For example, a current source having the same function as the resistors R may be provided instead of the resistors.

Embodiment 2

Hereinafter, a digital equalization apparatus according to a second embodiment will be described with reference to FIGS. 2, 4, and 15. The digital equalization apparatus according to the second embodiment gives a non-linear characteristic to an analog signal having a large amplitude difference, subjects the analog signal to A/D conversion, and waveform-equalizes a digital signal obtained by the A/D conversion.

Figure 4:
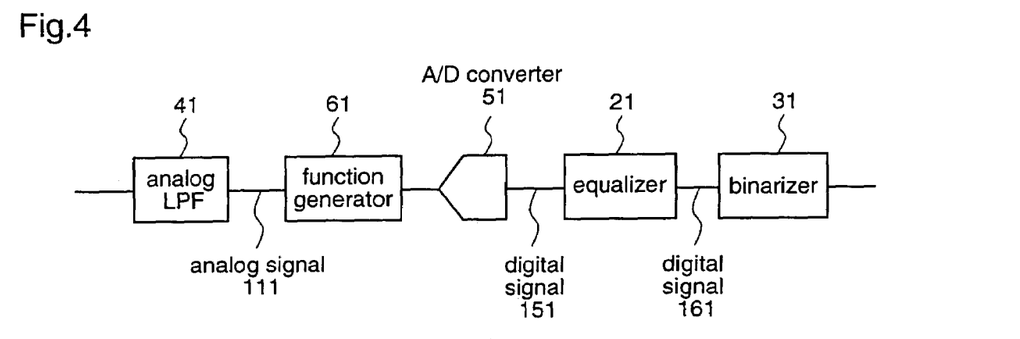
FIG. 4 is a block diagram illustrating a digital equalization apparatus according to a second embodiment of the present invention.

FIG. 4 is a block diagram illustrating the construction of the digital equalization apparatus according to the second embodiment. As shown in FIG. 4, the digital equalization apparatus is provided with an analog LPF 41, a function generator 61, an A/D converter 51, an equalizer 21, and a binarizer 31.

The operation of the digital equalization apparatus constituted as described above will be described. The analog LPF 41, the equalizer 21, and the binarizer 31 operate in like manners as the analog LPF 4, the equalizer 2, and the binarizer 3, respectively. Therefore, repeated description is not necessary. The function generator 61 gives a non-linear characteristic to an inputted analog signal 111. In the following description, it is premised that the analog signal 111 is the analog signal 100 shown in FIG. 15(a). As shown in FIG. 15(a), an amplitude difference occurs in the analog signal 100. The function generator 61 gives a non-linear characteristic to the analog signal 111 so as to reduce the amplitude difference. To be specific, the function generator 61 demodulates the analog signal to give a non-linear characteristic expressing a function as illustrated by the curve 10 in FIG. 2, to the analog signal. Thereby, the analog waveform of the analog signal 111 is changed from an analog waveform 105 shown in FIG. 15(a) to an analog waveform 104 shown in FIG. 15(b). The A/D converter 51 samples the analog signal 111 having the analog waveform image 104 to obtain a sampling value 103, thereby converting the analog signal into a digital signal 151.

As described above, the digital equalization apparatus according to the second embodiment is provided with the function generator 61 for giving a non-linear characteristic realized by an arbitrary function to the analog signal, the A/D converter 51 for converting the analog signal outputted from the function generator 61 into a digital signal, and the digital equalizer 21 for waveform-equalizing the digital signal. The non-linear characteristic to be given to the analog signal from the function generator 61 is realized by an arbitrary function which has a predetermined position in the signal amplitude as a reference point, increases the A/D resolution per LSB in the vicinity of the reference point, and compensates for a reduction in the signal amplitude of the high-frequency component. Therefore, the signal component including necessary information in the analog signal having a large amplitude difference can be waveform-equalized with higher accuracy by using the function generator, the A/D converter, and the digital equalizer.

While in this second embodiment the function generator 61 gives the non-linear characteristic realized by the logarithmic function, the function for realizing the non-linear characteristic is not restricted thereto. For example, a function having a curve 11 shown in FIG. 3 may be employed.

Embodiment 3

Figure 5:
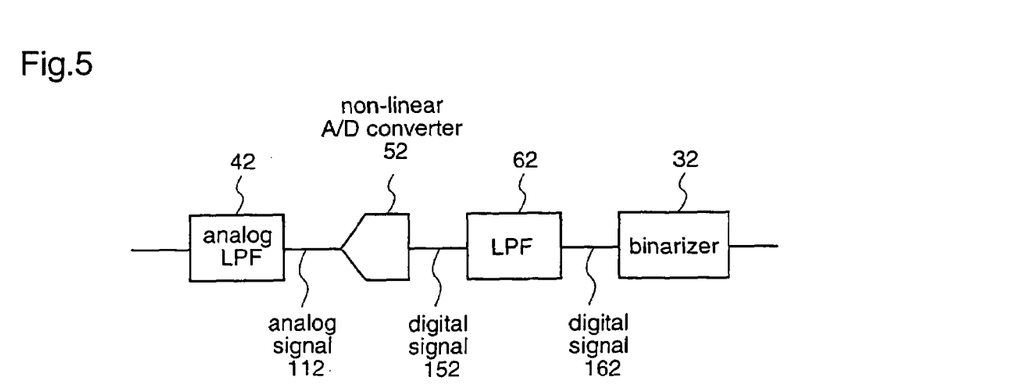
FIG. 5 is a block diagram illustrating a digital equalization apparatus according to a third embodiment of the present invention.

Hereinafter, a digital equalization apparatus according to a third embodiment of the present invention will be described with reference to FIGS. 5 and 14. The digital equalization apparatus according to the third embodiment converts an analog signal into a digital signal by using a non-linear A/D converter, and waveform-equalizes the digital signal. FIG. 5 is a block diagram illustrating the construction of the digital equalization apparatus according to the third embodiment. FIG. 14 is a schematic diagram illustrating an example of LPF characteristic of a LPF 62. As shown in FIG. 5, the digital equalization apparatus is provided with an analog LPF 42, a non-linear A/D converter 52, a LPF 62, and a binarizer 32.

The operation of the digital equalization apparatus constituted as described above will be described. The analog LPF 42, the non-linear A/D converter 52, and the binarizer 32 operate in like manners as the analog LPF 4, the non-linear A/D converter 1, and the binarizer 3 shown in FIG. 1, respectively.

The digital equalization apparatus according to the third embodiment waveform-equalizes a digital signal using not an equalizer, but the LPF 62. The LPF 62 has a LPF characteristic 13 shown in FIG. 14. The LPF 62 receives a digital signal 152 outputted from the non-linear A/D converter 52, and passes a signal component having a predetermined frequency, thereby removing harmonics distortion included in the digital signal 152.

As described above, the digital equalization apparatus according to the third embodiment is provided with the non-linear A/D converter 52 having the non-linear characteristic realized by an arbitrary function, and the LPF 62 for removing a harmonic distortion component that is caused by the non-linear A/D conversion. The non-linear characteristic of the non-linear A/D converter 1 is realized by an arbitrary function which has a predetermined position in the signal amplitude as a reference point, increases the A/D resolution per LSB in the vicinity of the reference point, and compensates for a reduction in the signal amplitude of the high-frequency component. Thereby, a signal component including necessary information in the analog signal having a large amplitude difference can be waveform-equalized with high accuracy by using the non-linear A/D converter and the LPF.

Embodiment 4

Figure 6:
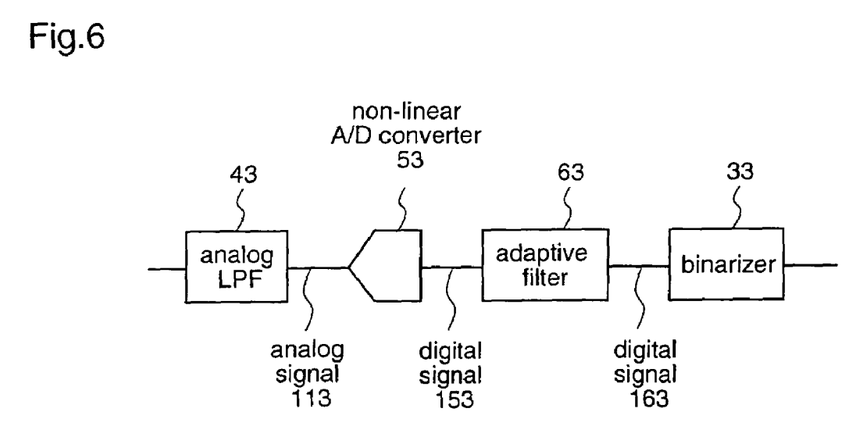
FIG. 6 is a block diagram illustrating a digital equalization apparatus according to a fourth embodiment of the present invention.

Hereinafter, a digital equalization apparatus according to a fourth embodiment of the present invention will be described with reference to FIG. 6. The digital equalization apparatus according to the fourth embodiment converts an analog signal into a digital signal using a non-linear A/D converter, and waveform-equalizes the digital signal. FIG. 6 is a block diagram illustrating the construction of the digital equalization apparatus according to the fourth embodiment. As shown in FIG. 6, the digital equalization apparatus is provided with an analog LPF 43, a non-linear A/D converter 53, an adaptive filter 63, and a binarizer 33.

The operation of the digital equalization apparatus constituted as described above will be described. The analog LPF 43, the non-linear A/D converter 53, and the binarizer 33 operate in like manners as the analog LPF 4, the non-linear A/D converter 1, and the binarizer 3 shown in FIG. 1, respectively. Therefore, repeated description is not necessary.

In this fourth embodiment, a digital signal is waveform-equalized using not a digital equalizer, but the adaptive filter 63. The adaptive filter 63 compares the signal level of a non-linearly A/D converted digital signal with a desired signal level, and feeds a difference between them back to the filter characteristic, thereby adaptively waveform-equalizing the digital signal.

As described above, the digital equalization apparatus according to the fourth embodiment waveform-equalizes the non-linearly A/D converted digital signal by the adaptive filter 63, whereby variations in the output signal are suppressed, and the accuracy of the subsequent signal reproduction processing is improved.

Embodiment 5

Figure 7:
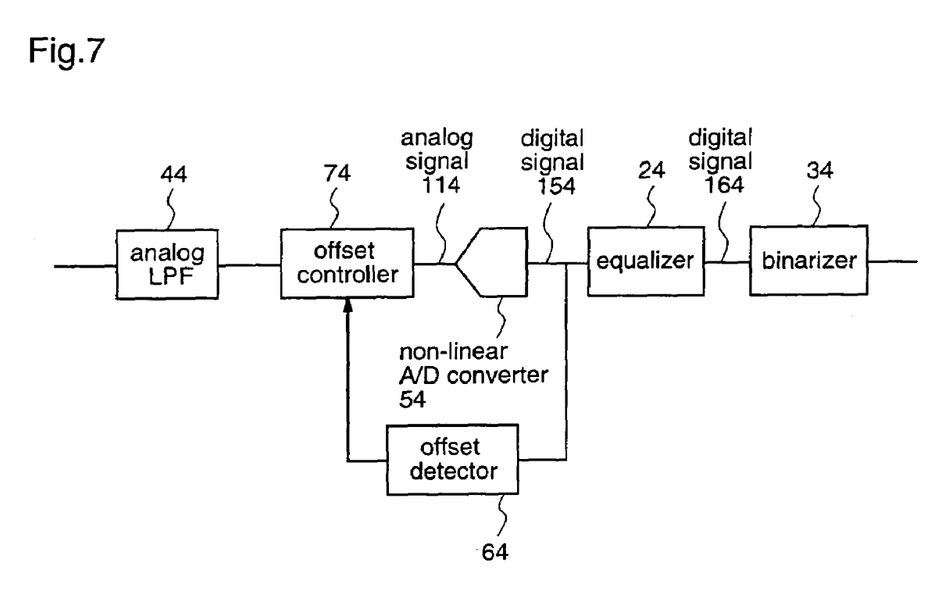
FIG. 7 is a block diagram illustrating a digital equalization apparatus according to a fifth embodiment of the present invention.
Figure 8A:
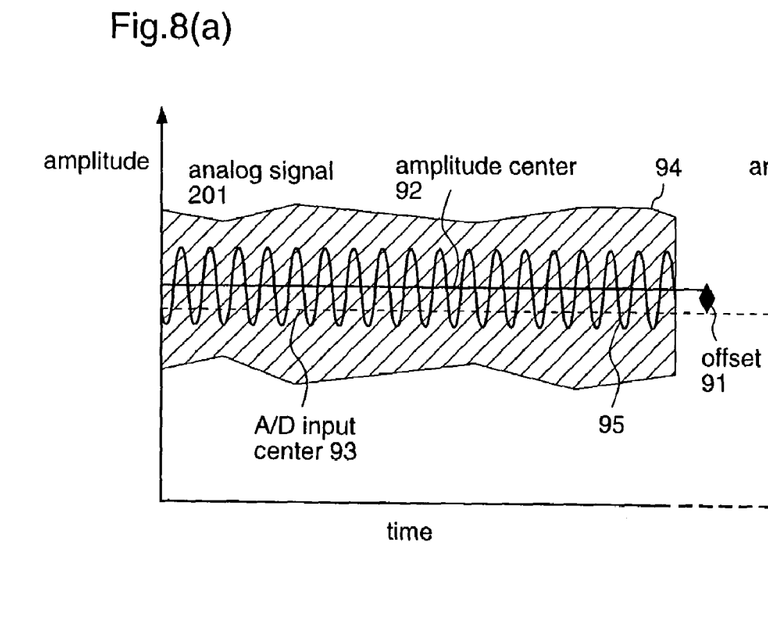
FIG. 8(a) is a schematic diagram illustrating an analog signal including an offset.
Figure 8B:
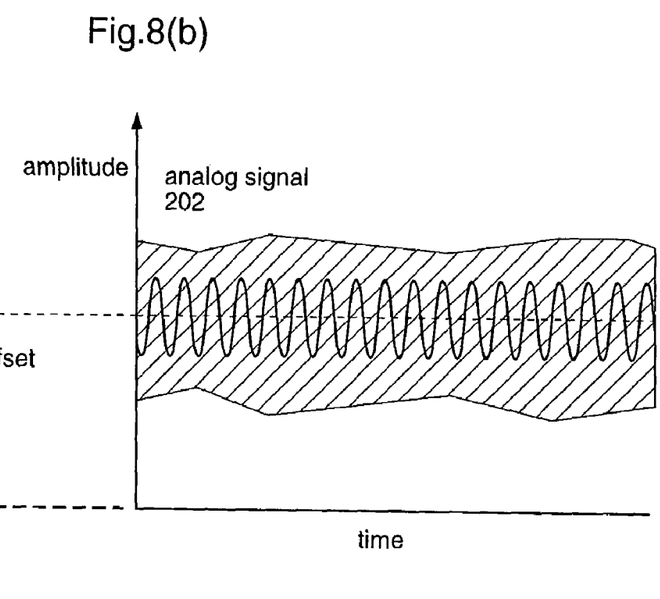
FIG. 8(b) is a schematic diagram illustrating an analog signal including no offset.

Hereinafter, a digital equalization apparatus according to a fifth embodiment of the present invention will be described with reference to FIGS. 7 and 8. The digital equalization apparatus according to the fifth embodiment converts an analog signal into a digital signal using a non-linear A/D converter, and waveform-equalizes the digital signal. FIG. 7 is a block diagram illustrating the construction of the digital equalization apparatus according to the fifth embodiment. As shown in FIG. 7, the digital equalization apparatus is provided with an analog LPF 44, an offset detector 64, an offset controller 74, a non-linear A/D converter 54, an equalizer 24, and a binarizer 34.

The operation of the digital equalization apparatus constituted as described above will be described with reference to FIG. 7 and FIGS. 8(*a*) and 8(*b*). FIG. 8(*a*) is a schematic diagram illustrating an analog signal in which an offset occurs. FIG. 8(*b*) is a schematic diagram illustrating the analog signal from which the offset is removed. The analog LPF 44, the non-linear A/D converter 54, the equalizer 24, and the binarizer 34 operate in like manners as the analog LPF 4, the non-linear A/D converter 1, the equalizer 2, and the binarizer 3 shown in FIG. 1, respectively. Therefore, repeated description is not necessary.

Although, in the first, third, and fourth embodiments, the non-linear A/D converter non-linearly converts an analog signal into a digital signal, there may be cases where the analog signal deviates from a reference voltage. That is, there may be cases where an offset occurs. Then, as shown in FIG. 8(*a*), an A/D input center 93 of the non-linear A/D converter deviates from an amplitude center 92 of the analog signal inputted to the non-linear A/D converter. In FIG. 8(*a*), 94 denotes the whole amplitude of an analog signal 201, and 95 denotes the amplitude of a high-frequency component in the analog signal 201.

In the digital equalization apparatus according to the fifth embodiment, the offset detector 64 receives the digital signal outputted from the non-linear A/D converter 54, and detects an offset 91 which is a difference between the A/D input center 93 of the non-linear A/D converter 54 and the amplitude center 92 of the analog signal 201, from the digital signal. Then, the offset controller 74 receives the result of detection, and removes the offset component from the inputted analog signal 201. To be specific, an inverse offset is given at a low-frequency in accordance with the amount of offset. Thereby, the analog signal 114 outputted from the offset controller 74 becomes the analog signal 202 shown in FIG. 8(*b*).

Hereinafter, a concrete example of detection for an offset of an analog signal from a digital signal will be described. The digital signal 154 as the output of the non-linear A/D converter 54 takes finite values, and all of the values are expressed by digital values. The offset detector 64 receives the digital signal 154, and converts the respective digital values with a digital value corresponding to the input center 93 of the non-linear A/D converter 54 being 0. Then, the offset detector 64 arithmetically processes the converted digital values to obtain an offset indicating a deviation toward the plus side or a deviation toward the minus side. As examples of arithmetic methods at this time, the following two methods can be employed. One is a method of directly adding the converted digital values. For example, assuming that the digital values are 1, 4, 7, 10, 6, 4, 2, 0, −2, −5, −6, −12, −9, . . . , these values are added. The other is a method of adding only information indicating whether the digital values are larger than 0 or smaller than 0 with 0 being a reference. For example, assuming that the digital values are 1, 4, 7, 10, 6, 4, 2, 0, −2, −5, −6, −12, −9, . . . , the digital values larger than 0 are regarded as "1" while the digital values smaller than 0 are regarded as "−1", and addition is carried out like 1+1+1+1+1+1+1−1−1−1−1−1−1, . . . By performing the above-mentioned arithmetic operation, a value indicating plus or minus is detected as an offset portion. That is, an offset indicating a deviation toward the plus side or a deviation toward the minus side is obtained.

The offset thus obtained is supplied through a D/A converter (not shown) to the offset controller 74 as an analog circuit. The D/A converter may be included in the offset detector 64.

As described above, the digital equalization apparatus according to the fifth embodiment is provided with the offset detector 64 for detecting an offset of an analog signal, and the offset controller 74 for removing the offset. Therefore, the input center of the non-linear A/D converter matches the amplitude center of the analog signal inputted to the non-linear A/D converter, whereby the center of the analog signal including necessary information can be non-linearly A/D converted with higher resolution.

Embodiment 6

Figure 9:
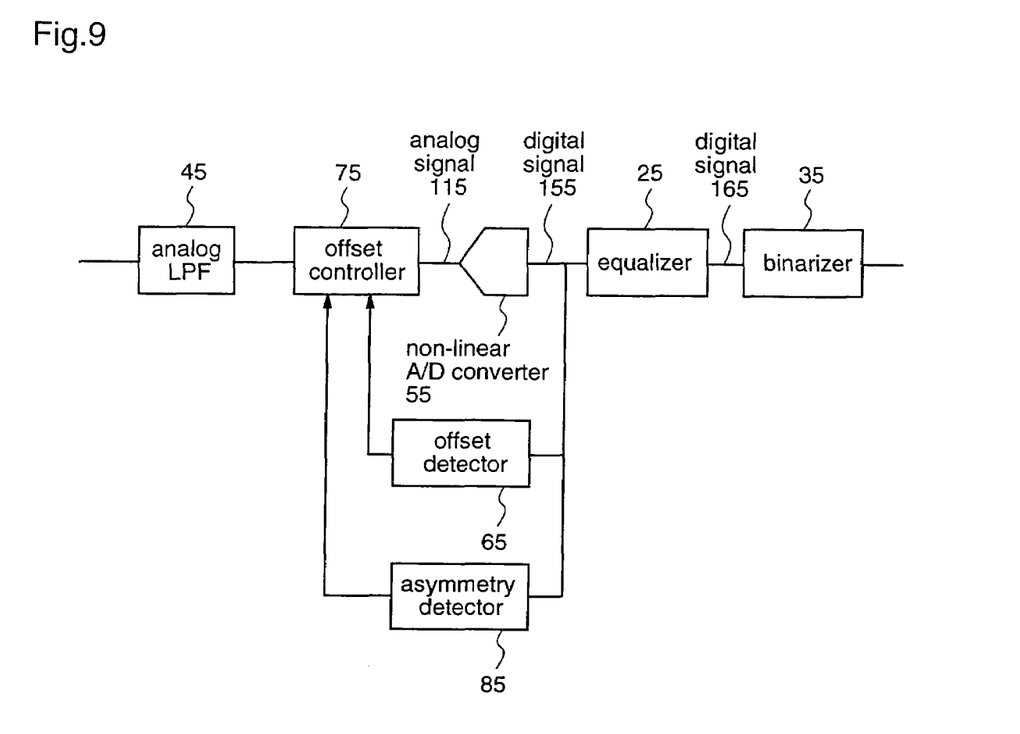
FIG. 9 is a block diagram illustrating a digital equalization apparatus according to a sixth embodiment of the present invention.

Hereinafter, a digital equalization apparatus according to a sixth embodiment of the present invention will be described with reference to FIG. 9. The digital equalization apparatus according to the sixth embodiment converts an analog signal into a digital signal using a non-linear A/D converter, and waveform-equalizes the digital signal. FIG. 9 is a block diagram illustrating the construction of the digital equalization apparatus. As shown in FIG. 9, the digital equalization apparatus is provided with an analog LPF 45, an offset detector 65, an offset controller 75, a non-linear A/D converter 55, an equalizer 25, a binarizer 35, and an asymmetry detector 85.

Figure 10A:
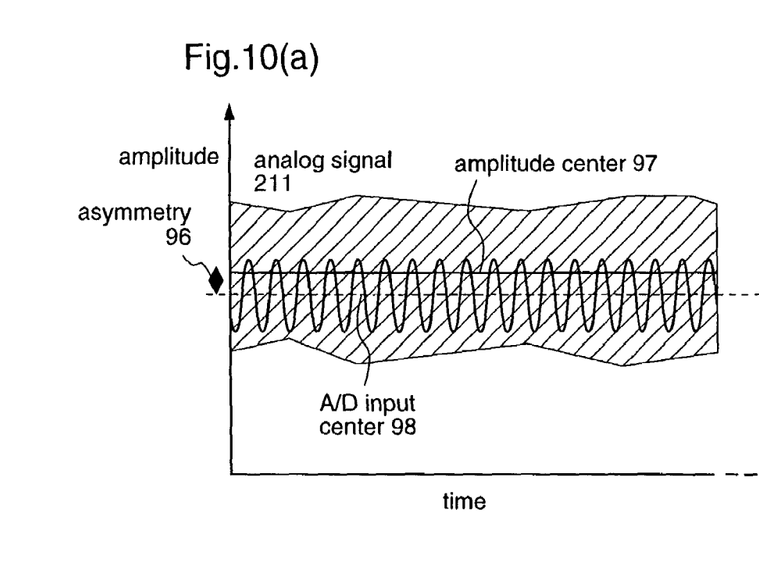
FIG. 10(a) is a schematic diagram illustrating an analog signal including an asymmetry.
Figure 10B:
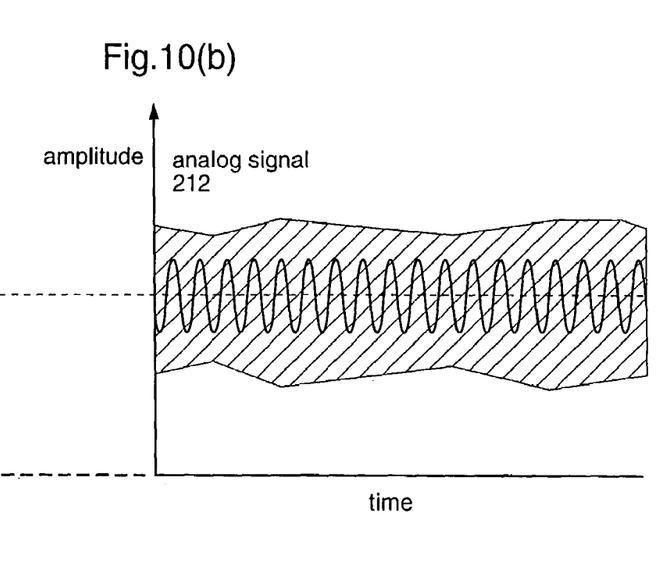
FIG. 10(b) is a schematic diagram illustrating an analog signal including no asymmetry.

The operation of the digital equalization apparatus constituted as described above will be described with reference to FIG. 9 and FIGS. 10(a) and 10(b). The analog LPF 45, the non-linear A/D converter 55, the equalizer 25, the binarizer 35, and the offset detector 65 operate in like manners as the analog LPF 44, the non-linear A/D converter 54, the equalizer 24, the binarizer 34, and the offset detector 64 shown in FIG. 7, respectively. Therefore, repeated description is not necessary. FIG. 10(a) is a schematic diagram illustrating an analog signal in which an asymmetry occurs. FIG. 10(b) is a schematic diagram illustrating the analog signal in which the asymmetry is corrected.

Although, in the digital equalization apparatuses according to first, third, and fifth embodiment, the non-linear A/D converter non-linearly converts an input analog signal into a digital signal, there may be cases where an asymmetry occurs in the analog signal, as well as an offset described for the fifth embodiment. Then, as shown in FIG. 10(a), an A/D input center 98 of the non-linear A/D center 55 deviates from an amplitude center 97 of the analog signal 211 due to the asymmetry 96. Accordingly, the digital equalization apparatus of this sixth embodiment is provided with, in addition to the offset detector 65, the asymmetry detector 85 which receives the digital signal 155 outputted from the non-linear A/D converter 55, and detects the asymmetry 96. Then, the offset controller 75 removes the offset of the analog signal outputted from the analog LPF 45, on the basis of the result of detection by the offset detector 65 and the result of detection by the asymmetry detector 85, and changes the center value (reference voltage level) of the analog signal according to the asymmetry 96. When the asymmetry is corrected, the analog signal 211 shown in FIG. 10(a) becomes the analog signal 212 shown in FIG. 10(b).

Hereinafter, a method for detecting an asymmetry of an analog signal from a digital signal will be described. Since regularity of the waveform of the analog signal has previously been known, it is possible to estimate regularity of the digital signal obtained by A/D converting the analog signal. The asymmetry detector 85 calculates (summation) a deviation of the regularity of the digital signal 155 from the estimated regularity of the digital signal in like manner as described for the offset detection. The calculation result thus obtained is supplied as the asymmetry 96 through a D/A converter to the offset controller 75 as an analog circuit.

As described above, the digital equalization apparatus according to the sixth embodiment is provided with the offset detector 65 for detecting an offset of the analog signal, the asymmetry detector 85 for detecting an asymmetry of the analog signal, and the offset controller 75 for removing the offset and correcting the asymmetry. Therefore, the input center of the non-linear A/D converter matches the amplitude center of the analog signal inputted to the non-linear A/D converter, whereby the center of the analog signal including necessary information can be non-linearly A/D converted with higher resolution.

Embodiment 7

Figure 11:
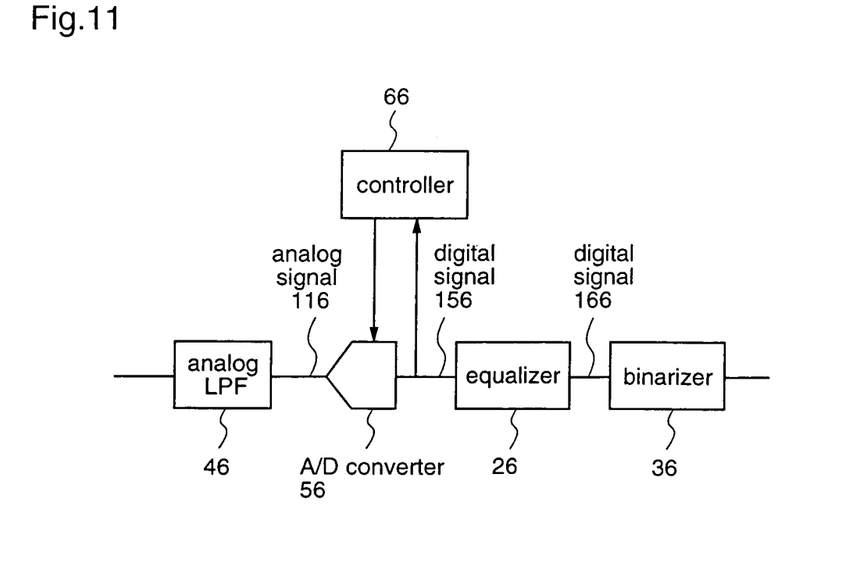
FIG. 11 is a block diagram illustrating a digital equalization apparatus according to a seventh embodiment of the present invention.

Hereinafter, a digital equalization apparatus according to a seventh embodiment will be described with reference to FIGS. 11 and 12. The digital equalization apparatus according to the seventh embodiment converts an analog signal into a digital signal by a non-linear A/D converter realized by using an A/D converter, and waveform-equalizes the digital signal. As shown in FIG. 11, the digital equalization apparatus is provided with an analog LPF 46, a controller 66, an A/D converter 56, an equalizer 26, and a binarizer 36.

The operation of the digital equalization apparatus constituted as described above will be described with reference to FIG. 12. The analog LPF 46, the equalizer 26, and the binarizer 36 operate in like manners as the analog LPF 4, the equalizer 2, and the binarizer 3 shown in FIG. 1, respectively. Therefore, repeated description is not necessary.

In the digital equalization apparatuses according to the first to sixth embodiments, an analog signal is non-linearly converted into a digital signal using a non-linear A/D converter having a predetermined non-linear characteristic, or a predetermined non-linear characteristic is given to an analog signal using a function generator and then the analog signal is converted into a digital signal. On the other hand, in the digital equalization apparatus according to the seventh embodiment, the controller 66 controls the reference voltage of the A/D converter 56 to realize non-linear A/D conversion.

Hereinafter, the technique will be described with reference to FIG. 12. In order to realize a non-linear A/D converter using the A/D converter shown in FIG. 12, it is necessary to change the resistance values of the respective resistors in the first and third to sixth embodiments. On the other hand, in the digital equalization apparatus according to the seventh embodiment, the controller 66 controls the low reference voltage and the high reference voltage inputted to the A/D converter, thereby to control the output code corresponding to the input analog signal. For example, the signal level of the input analog signal is kept constant, and the low reference voltage and the high reference voltage are demodulated with a sinusoidal wave and then inputted to the A/D converter, whereby the output code provides a result as if the input analog signal was a sinusoidal wave signal. Utilizing this characteristic, the controller 66 detects the output of the A/D converter 56, demodulates the low reference voltage and the high reference voltage in accordance with the level of the input analog signal, thereby making the A/D converter 56 have a non-linear characteristic realized by an arbitrary function. Thereby, the A/D converter 56 can subject the analog signal to non-linear A/D conversion. As for the arbitrary function, the logarithmic function shown in FIG. 2 or the function shown in FIG. 3 can be employed.

In the digital equalization apparatus according to the seventh embodiment, when the output of the A/D converter 56 is detected, if an offset is included in the analog signal 116, the reference voltage is adjusted to remove the offset. Further, when an asymmetry occurs in the analog signal, the reference voltage is demodulated to correct the asymmetry. Thereby, the input center of the non-linear A/D converter 56 can be matched to the amplitude center of the analog signal 116. Since the methods of detecting an offset and an asymmetry have already been described for the fifth and sixth embodiments, respectively, repeated description is not necessary.

As described above, the digital equalization apparatus of this seventh embodiment is provided with the controller 66 for controlling the reference voltage of the A/D converter 56. Therefore, the controller 66 can change the A/D converter 56 to a means capable of non-linear A/D conversion. Further, the center of the input to the non-linear A/D converter 56 can be matched to the center of the amplitude of the analog signal inputted to the A/D converter by controlling the reference voltage with the controller 66. As a result, the center portion of the analog signal including necessary information can be subjected to non-linear A/D conversion with higher resolution.

What is claimed is:

1. A digital equalization apparatus for an information storage device, the digital equalization apparatus comprising:
    a non-linear A/D converter for non-linearly sampling an analog signal to convert the analog signal into a digital signal; and
    a digital filter for waveform-filtering the digital signal outputted from said non-linear A/D converter.

2. A digital equalization apparatus as defined in claim 1, wherein said non-linear A/D converter has a non-linear characteristic realized by an arbitrary function.

3. A digital equalization apparatus as defined in claim 1, wherein said non-linear A/D converter changes a weight of resolution per LSB (Least Significant Bit) in A/D conversion such that, with a center value of amplitude of the analog signal being a reference value, the resolution per LSB becomes higher as an input center of said non-linear A/D converter is closer to the center value and the resolution per LSB becomes lower as the input center of said non-linear A/D converter is farther from the center value.

4. A digital equalization apparatus as defined in claim 1, wherein said non-linear A/D converter changes a weight of resolution per LSB in A/D conversion such that, with a point at a predetermined distance from a center value of the analog signal being a reference value, the resolution per LSB becomes higher as an input center of said non-linear A/D converter is closer to the reference value and the resolution per LSB becomes lower as the input center of said non-linear A/D converter is farther from the reference value.

5. A digital equalization apparatus as defined in claim 1, wherein said non-linear A/D converter changes a weight of resolution per LSB in A/D conversion such that, with a center value of the analog signal being a reference value, the resolution per LSB becomes relatively high within a range until a predetermined distance from the center value and the resolution per LSB becomes relatively low within a range that is more than the predetermined distance apart from the center value.

6. A digital equalization apparatus for an information storage device, the digital equalization apparatus comprising:
    a function generator for providing a non-linear characteristic shown by an arbitrary function to an analog signal;
    an A/D converter for converting the analog signal outputted from said function generator into a digital signal; and
    a digital equalizer for waveform-equalizing the digital signal outputted from said A/D converter.

7. A digital equalization apparatus as defined in claim 1, wherein
    said digital filter is a low-pass filter for waveform-equalizing the digital signal outputted from said non-linear A/D converter, and
    said low-pass filter removes a harmonic distortion component of the digital signal generated by said non-linear A/D converter.

8. A digital equalization apparatus as defined in claim 1, wherein
    said digital filter is an adaptive filter for comparing a signal level of the digital signal outputted from said non-linear A/D converter with a desired signal level, and feeding a difference between the signal level and the desired signal level back to an equalization characteristic, thereby adaptively waveform-equalizing the digital signal all the time.

9. A digital equalization apparatus as defined in claim 1, further comprising:
    an offset detector for detecting a deviation of the analog signal inputted to said non-linear A/D converter from a reference voltage, from the digital signal outputted from said non-linear A/D converter; and
    an offset controller for providing an offset to the analog signal on the basis of an output of said offset detector.

10. A digital equalization apparatus as defined in claim 9, further comprising:
    an asymmetry detector for detecting asymmetry of the analog signal inputted to said non-linear A/D converter, from the digital signal outputted by said non-linear A/D converter, wherein
    said offset controller provides the offset to the analog signal, and changes a level of the reference voltage of the analog signal according to the asymmetry, on the basis of the output of said offset detector and an output of said asymmetry detector.

11. A digital equalization apparatus for an information storage device, the digital equalization apparatus comprising:
    an A/D converter for converting an analog signal into a digital signal;
    a digital equalizer for waveform-equalizing the digital signal outputted from said A/D converter; and
    a controller for receiving the digital signal outputted from said A/D converter, and controlling a higher-potential-side reference voltage and a lower-potential-side reference voltage of said A/D converter, according to a signal level of the analog signal inputted to said A/D converter.

12. A digital equalization apparatus as defined in claim 11, wherein said controller detects offsets as deviations of the analog signal inputted to said A/D converter from the higher-potential side and lower potential side reference voltages, and asymmetry of the analog signal, from the digital signal outputted from said A/D converter, and demodulates the higher-potential-side reference voltage and the lower-potential-side reference voltage of said A/D converter, thereby removing the offsets.

* * * * *